(12) United States Patent
Weisenberger et al.

(10) Patent No.: US 10,358,535 B2
(45) Date of Patent: *Jul. 23, 2019

(54) THERMAL INTERFACE MATERIAL

(75) Inventors: Matthew Collins Weisenberger, Georgetown, KY (US); John Davis Craddock, Lawrenceburg, KY (US)

(73) Assignee: THE UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 278 days.

This patent is subject to a terminal disclaimer.

(21) Appl. No.: 13/299,909

(22) Filed: Nov. 18, 2011

(65) Prior Publication Data

US 2012/0060826 A1 Mar. 15, 2012

Related U.S. Application Data

(63) Continuation-in-part of application No. 12/109,735, filed on Apr. 25, 2008, now Pat. No. 8,632,879.

(51) Int. Cl.
| | | |
|---|---|---|
| *C08J 5/00* | (2006.01) | |
| *C08J 5/24* | (2006.01) | |
| *H01L 23/373* | (2006.01) | |
| *B82Y 30/00* | (2011.01) | |
| *B29C 63/08* | (2006.01) | |

(52) U.S. Cl.
CPC .............. *C08J 5/005* (2013.01); *B82Y 30/00* (2013.01); *C08J 5/24* (2013.01); *H01L 23/3737* (2013.01); *B29C 63/08* (2013.01); *C08J 2363/00* (2013.01); *H01L 2924/0002* (2013.01); *Y10T 428/24174* (2015.01)

(58) Field of Classification Search
CPC .............. H01L 23/3737; H01L 2924/0002; C08J 5/24; C08J 2363/00; C08J 2363/04; C08J 2363/06; C08J 2363/08; C08J 5/005; C08J 2363/02; C08J 2363/10; Y10T 428/24174; B29C 63/08; B29C 63/10; B29C 63/105; B82Y 30/00
USPC ....... 428/119, 120, 212, 213, 214, 215, 216, 428/218, 219, 220, 221, 297.4, 298.1, 428/299.1, 332, 333, 334, 335, 336, 337, 428/339, 340, 341, 343, 364, 367, 375, 428/397, 398, 401, 903; 977/742–752
See application file for complete search history.

(56) References Cited

U.S. PATENT DOCUMENTS

| | | |
|---|---|---|
| 6,428,890 B1 | 8/2002 | Ting |
| 6,863,942 B2 | 3/2005 | Ren et al. |
| 6,987,071 B1 | 1/2006 | Bollman et al. |
| 6,989,123 B2 | 1/2006 | Lee et al. |

(Continued)

FOREIGN PATENT DOCUMENTS

| | | | | |
|---|---|---|---|---|
| WO | WO 2006099156 A2 * | 9/2006 | ............. | B82Y 30/00 |
| WO | WO 2007008214 A1 * | 1/2007 | ............. | B82Y 30/00 |
| WO | WO 2007136755 A2 * | 11/2007 | ............. | B82B 1/00 |

*Primary Examiner* — Jennifer A Steele
(74) *Attorney, Agent, or Firm* — King & Schickli, PLLC

(57) ABSTRACT

A flexible sheet of aligned carbon nanotubes includes an array of aligned nanotubes in a free standing film form not adhered to the synthesis substrate, with a matrix infiltrated interstitially into the nanotube array with access to the nanotube tips from both the top and bottom. That is, the infiltrant is purposely limited from over-filling or coating one or both exterior top and/or bottom surfaces of the array, blocking access to the tips. A typical matrix is a polymer material.

11 Claims, 6 Drawing Sheets

(56) References Cited

U.S. PATENT DOCUMENTS

| | | |
|---|---|---|
| 7,053,520 B2 | 5/2006 | Zetti et al. |
| 7,119,028 B1 | 10/2006 | Roberts et al. |
| 7,132,126 B2 | 11/2006 | Lee et al. |
| 7,160,531 B1 | 1/2007 | Jacques et al. |
| 2003/0017331 A1* | 1/2003 | Okochi .............. C08G 18/3284 428/343 |
| 2003/0143453 A1 | 7/2003 | Ren et al. |
| 2003/0165418 A1 | 9/2003 | Ajayan et al. |
| 2004/0266063 A1* | 12/2004 | Montgomery ......... B82Y 10/00 438/119 |
| 2005/0244650 A1* | 11/2005 | Ren .................... B29C 47/0004 428/421 |
| 2006/0279191 A1* | 12/2006 | Geohegan .............. B82Y 10/00 313/309 |
| 2007/0116626 A1 | 5/2007 | Pan et al. |
| 2007/0222472 A1 | 9/2007 | Raravikar et al. |
| 2008/0048364 A1* | 2/2008 | Armeniades et al. ..... 264/328.1 |
| 2008/0128122 A1* | 6/2008 | Huang et al. ................. 165/185 |
| 2008/0308209 A1* | 12/2008 | Loutfy et al. ................ 156/62.2 |
| 2009/0266477 A1* | 10/2009 | Weisenberger ........ B82Y 30/00 156/185 |
| 2009/0311166 A1* | 12/2009 | Hart ......................... B82B 1/00 423/445 B |
| 2010/0075024 A1* | 3/2010 | Ajayan .................... C08K 7/24 427/66 |

* cited by examiner

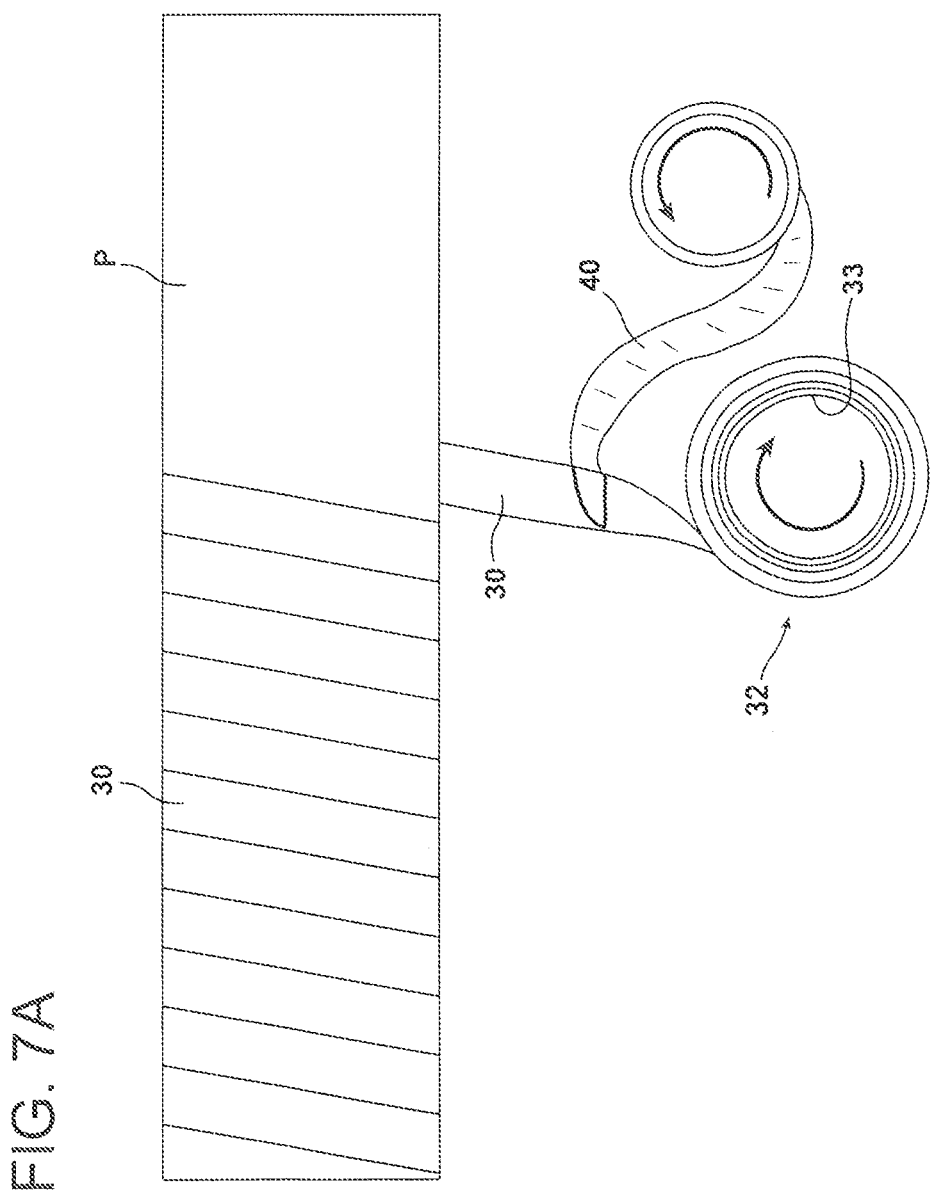

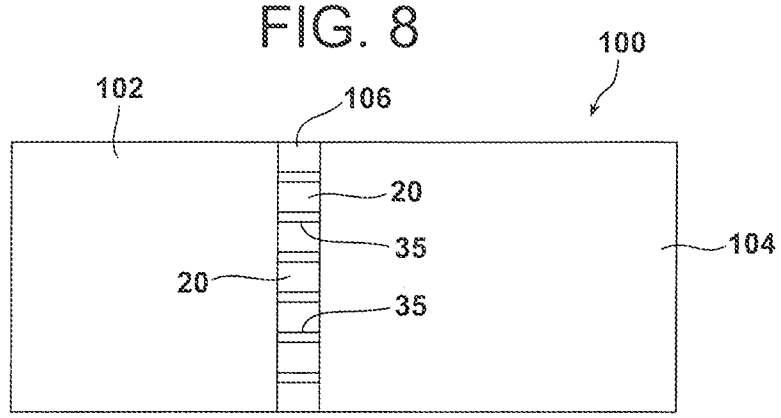
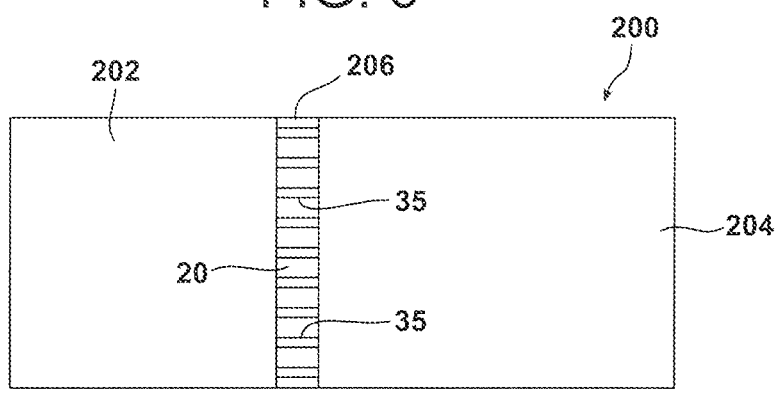
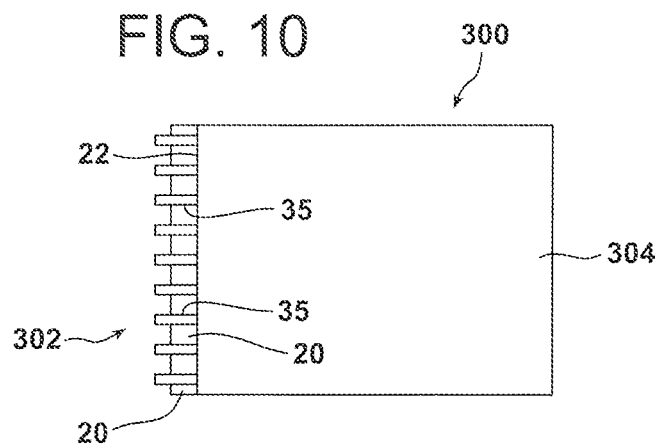

THERMAL INTERFACE MATERIAL

This application is a continuation-in-part of U.S. patent application Ser. No. 12/109,735 filed on 25 Apr. 2008, now U.S. Pat. No. 8,632,879, the full disclosure of which is incorporated herein by reference.

This invention, was, made with government support under contract W31P4Q-07-C-0075 awarded by U.S. Department of Army. The government has certain rights in the invention.

TECHNICAL FIELD AND INDUSTRIAL APPLICABILITY OF THE INVENTION

The present invention relates generally to thermal management materials and, more particularly, to thermal management materials incorporating aligned carbon nanotubes held in a polymer matrix and methods for producing such materials.

BACKGROUND OF THE INVENTION

A carbon nanotube is a microscopic, hollow filament comprised of carbon atoms arranged in the shape of a cylinder. Carbon nanotubes are typically on the order of nanometers in diameter but may be produced with lengths of up to several hundred microns. Carbon nanotubes possess high electrical and thermal conductivities in the direction of the longitudinal axis of the carbon nanotubes. Individual carbon nanotubes have displayed thermal conductivities of 3000 W/m-° K. and higher at room temperature.

It is known to use composites of aligned carbon nanotubes and a polymer matrix in thermal management applications. Examples of such composite used for thermal applications are found in U.S. Pat. No. 6,428,890 to Ting and in published U.S. Patent Applications 2006/0279191 to Gohegan et al and 2007/0116626 to Pan et al. The present invention relates to improved composite materials made from carbon nanotubes and a polymer matrix including continuous tapes of such material as well as to methods of their production.

SUMMARY OF THE INVENTION

As described herein, a thermal interface material comprises a sheet including an array of aligned carbon nanotubes held in a polymer matrix material present in interstitial space between the aligned carbon nanotubes. The sheet includes a first face formed from exposed first ends of the aligned carbon nanotubes and a second face formed from exposed second ends of the aligned carbon nanotubes.

In one particularly useful embodiment, the thermal interface material is substrate free. Further, the polymer matrix material is only partially cured. The partially cured polymer matrix material may be selected from a group consisting of thermosetting resin, epoxy, vinyl ester, silicone, cyanate ester, bismaleimide (BMI), polyrnide, polyolefin, polyurethane, phenolic, a carbonizable resin, polyfurfural and mixtures thereof. In one particularly useful embodiment the polymer matrix material is a B-staged epoxy. Great care is taken to not over-infiltrate the nanotube array with polymer, which would result in an excess of polymer covering the tips of the nanotubes in a thick polymer film. Access to the tips of the nanotubes, from both top and bottom, is key for achieving high thermal conductivity through the polymer infiltrated nanotube array.

In yet another embodiment, the first face is covered with a removable ply of a polymer film and the sheet is wound onto a roll like tape. The tape comprises a nanotube layer including aligned carbon nanotubes, in a free-standing film form not adhered to the synthesis substrate with a polymer matrix infiltrated interstitially into the nanotube array with access to the nanotube tips from both the top and bottom. That is, the polymer infiltrant is purposely limited from over-filling or coating one or both exterior top and/or bottom surfaces of the array, blocking access to the tips. The resulting polymer-infiltrated nanotube array is a free-standing sheet of aligned nanotubes in which polymer is only allowed to infiltrate interstitially between the lengths of the nanotubes, not to coat the surfaces in a thick film. Therefore access to the exposed nanotube tips from BOTH the top and bottom is possible.

In accordance with an additional aspect, an electronic device is provided with improved thermal characteristics. The device includes an electronic component, a heat transfer device, and a thermal interface material connecting the electronic component with the heat transfer device. The thermal interface material comprises a sheet including an array of aligned carbon nanotubes held in a polymer matrix material present in interstitial space between the aligned carbon nanotubes. The sheet includes a first face formed from exposed first ends of the aligned carbon nanotubes and a second face form from exposed second ends of the aligned carbon nanotubes.

In accordance with yet another aspect, a current collecting device is provided comprising a current collector component, a charge donor device and a current collector interface material. The current collector interface material connects the current collector component with the charge donor device. The current collector interface material comprises a sheet including an array of aligned carbon nanotubes held in a polymer matrix material present in interstitial space between the aligned carbon nanotubes. The sheet includes a first face formed from exposed first ends of the aligned carbon nanotubes and a second face formed from exposed second ends of the aligned carbon nanotubes.

Still further, a solar thermal energy collecting device comprises a solar thermal energy collecting/absorbing component. The solar thermal energy collector/absorber material comprises a sheet including an array of aligned carbon nanotubes held in a polymer matrix material present in interstitial space between the aligned carbon nanotubes. The sheet includes a first face formed from exposed first ends of the aligned carbon nanotubes and a second face formed from exposed second ends of the aligned carbon nanotubes. The arrays are very optically black and absorb most wavelengths of light well.

Still further, one specific use of the interstitially infiltrated, MWCNT array thermal interface sheet material (TIM) would be as a thermal energy scavenging layer in the efficient conductive recovery of waste heat streams. Example waste heat streams may be from power plant exhaust gas systems, and in metal casting cooling.

Still further, one specific use of the interstitially infiltrated, MWCNT array thermal interface sheet material (TIM) would be as a thermal conduit layer in thermoelectric power generation devices. Here the MWCNT array TIM would function to route heat conductively to the active materials which generate the voltage.

BRIEF DESCRIPTION OF THE DRAWINGS

The accompanying drawings incorporated herein and forming a part of the specification, illustrate several aspects of the present invention and together with the description serve to explain certain principles of the invention. In the drawings:

FIGS. 7A and 7B are schematical side elevational views illustrating the winding of the tape onto a work piece;

FIG. 8 is a schematical illustration of an electronic device incorporating the new thermal interface material;

FIG. 9 is a schematical illustration of a current collecting device incorporating the new current collector interface material; and FIG. 10 is a schematical illustration of a solar thermal energy collecting device incorporating the new solar thermal energy interface material.

Reference will now be made in detail to the present preferred embodiments of the invention, examples of which are illustrated in the accompanying drawings.

DETAILED DESCRIPTION OF THE PREFERRED EMBODIMENTS OF THE INVENTION

Figure 1:
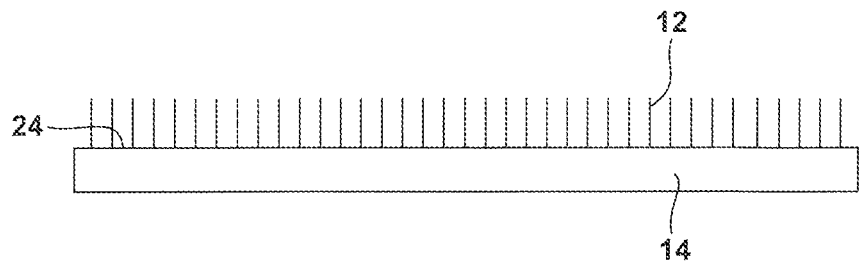
FIG. 1 is a partially schematical side elevational view illustrating the formation of aligned carbon nanotubes on a support substrate on which the aligned carbon nanotubes are synthesized.

Reference is now made to FIG. 1 illustrating an array of aligned carbon nanotubes 12 as grown and supported on a support substrate 14. The aligned carbon nanotubes may be grown in accordance with procedures well known in the art. One particularly useful process for the growing of aligned carbon nanotubes is set forth and described in U.S. Pat. Nos. 7,160,531 and 7,504,078 to Jacques et al. These patents are owned by the assignee of the present invention and the full disclosure therein is hereby incorporated into this document by reference.

Figure 2:
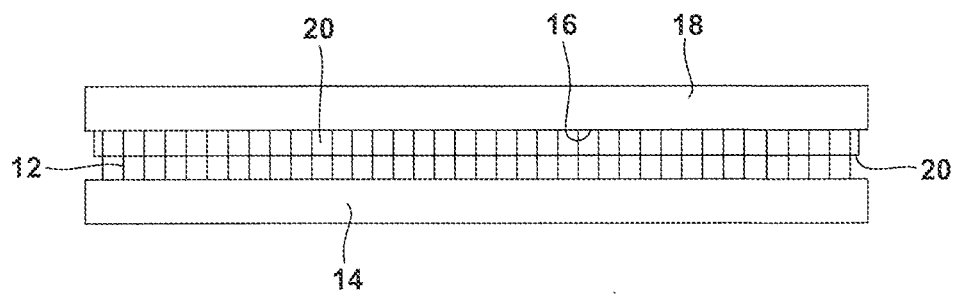
FIG. 2 is a view similar to FIG. 1 but illustrating the infiltration of the interstitial space between those aligned carbon nanotubes with a polymer matrix material.

FIG. 2 illustrates how the individual nanotubes of the array 12 are interstitially infiltrated. Specifically, one face 16 of a flexible support 18 is coated in a polymer material 20. The flexible support 18 may be made from any appropriate material including but not limited to polytetrafluroethylene (PTFE), fiber reinforced PTFE sheet, polyester, polyolefin, coated paper, coated fabric, wax, silicone flexible metal or rubber and mixtures thereof. The polymer material layer 20 may be made from any appropriate polymer matrix material including but not limited to any of a series of thermosetting or thermoplasic resins, including epoxy, vinyl ester, silicone, cyanate ester, bismaleimide (BMI), polyimide, polyolefin, polyurethane, phenolic, acrylic, polyester; carbonizable resin such as polyfurfural, pitch, or tar; or rubber and mixtures thereof. Typically, the flexible support 18 has a thickness of between about 100 microns and about 1 mm while the polymer layer 20 has a thickness of between about 10 microns and about 500 microns. After coating, the face 16 of the flexible support 18 coated in the polymer material 20 is placed over the exposed face of the aligned carbon nanotubes of the array 12 in order to interstitially infiltrate the array with the polymer (see FIG. 2). Appropriate pressure and heat may be applied to force the polymer layer 20 down into the interstices of array 12 of carbon nanotubes. Once the space between the carbon nanotubes in the array 12 has been sufficiently infiltrated with the polymer 20, the polymer is allowed to partially cure and/or solidify. Partial curing is commonly known as B-staging. The resulting polymer layer 20 assists holding the carbon nanotubes in the array 12 in alignment.

In one particularly useful and specific manner, the interstitial infiltration of the nanotube array is achieved by first having an uncured epoxy matrix 20 filmed onto the flexible support 18 resulting in a homogeneously thin film. At room temperature the epoxy film is slightly tacky, but uncured. This film is then placed over the aligned carbon nanotube array 12. The array 12, on substrate 14, with epoxy film 20 in contact with the exposed face of the array and on backer 18 with release coating 16 is then placed onto a flat, sturdy, heated aluminum plate and covered with a breather fabric for subsequent vacuum bagging. Utilizing typical vacuum bagging composite fabrication techniques, vacuum bagging gum tape is pre-applied to the aluminum forming a perimeter around the nanotube array stack (14, 12, 20, 16, 18, from bottom to top). The heated aluminum plate quickly heats the stack to approximately 80° C., causing a drastic and quick (within 10 s of seconds) reduction in viscosity of the filmed epoxy 20 which changes to a watery consistency. As quickly as possible, a temperature resistant polymer vacuum bag is pressed over the stack adhering to the gum tape perimeter, and a strong vacuum is pulled, causing the atmospheric pressure to homogeneously press the epoxy film into the nanotube array surface. Simultaneously, as the heat reduces the epoxy film's viscosity to a watery consistency, the epoxy film gets homogeneously drawn into the interstitial space between the nanotube lengths by capillary action. After a very short dwell time (10 s of seconds), the vacuum is released, the bag cut, and the epoxy film backer carefully removed leaving the epoxy interstitially infiltrated into the nanotube array. Silicone coated backer paper 18 assists in selective release of the backer paper 18 from the nanotube array, leaving the epoxy interstitially infiltrated into its thickness. Lastly, the interstitially infiltrated nanotube array, still fixed to its growth substrate 14, is moved to an unheated plate of aluminum, which quickly cools the substrate, the array, and the epoxy now infiltrated into the inter-nanotube interstices. This cooling prevents full cure of the epoxy, and enables it to be harvested as a free standing B-staged film, with both top and bottom nanotube tips 50, 52 exposed or uncovered by a layer of epoxy. Further, since the epoxy is uncured, the nanotube array can be utilized, in an interfacial situation between for example, a heat generator and a heat sink, to both provide for enhanced interfacial thermal transport, and to bond the interface as the interstitially infiltrated epoxy is externally cured at a later time.

Figure 3:
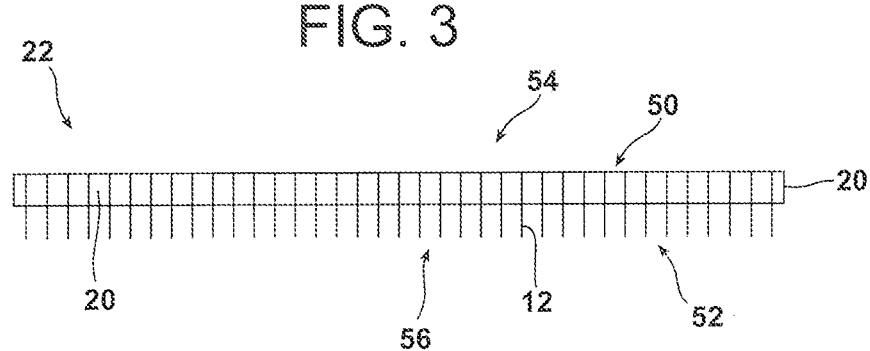
FIG. 3 is a view similar to FIGS. 1 and 2 but illustrating the removal of the substrate and the formation of a flexible sheet of aligned carbon nanotubes.

The next steps of the process are illustrated in FIG. 3. Generally, after partial curing or solidifying of the polymer layer 20, the non-stick support layer 18 is peeled away. This is followed by the separating or removing of the substrate 14 from the flexible aligned carbon nanotube sheet material 22 that comprises the carbon nanotube array 12 interstitially infiltrated by the polymer layer 20. This may be done by a number of processes including but not limited to shaving the array 12 from the substrate 14 and etching the substrate away with an acid. In the shaving process a sharp blade is held at a shallow angle to and against the surface 24 of the substrate 14. This process is described in detail in copending U.S. patent application Ser. No. 13/044,939 filed Mar. 10, 2011, entitled APPARATUS AND METHOD FOR HARVESTING CARBON NANOTUBE ARRAYS, the full disclosure of which is incorporated herein by reference. As the blade is pushed forward, the carbon nanotubes of the array 12 are cut free from the substrate 14 to provide the sheet of aligned carbon nanotubes 22. During shaving, it can be advantageous to temporarily allow the sheet 22 to roll up over a cylindrical, plastic roll. The sheet 22 may be subsequently unrolled for further processing or use. The etching process may be used, for example, where the substrate 14 is formed from metals. More specifically, acid may be used to dissolve a substrate and remove it without adversely affecting or damaging the carbon nanotube array 12, the polymer layer 20 or the flexible support 18.

The substrate free sheet 22 of aligned carbon nanotubes illustrated in FIG. 3 may be used as a final product. Typically, the carbon nanotubes 35 incorporated into the array 12 of the sheet 22 have an average length of between about 50 microns and about 500 microns. Typically, the polymer matrix layer 20 has an average thickness of between about 10 microns and about 500 microns. Further, the sheet 22 has a density of between about 0.2 and about 1.0 g/cc and includes between about 98 and about 60 weight percent aligned carbon nanotubes and between about 2 and about 40 weight percent polymer. As should be appreciated, the sheet 22 includes a first face 54 formed from the exposed first ends or tips 50 of the aligned carbon nanotubes 35 and a second face 56 formed from the exposed second ends or tips 52 of the aligned carbon nanotubes 35.

Figure 4:
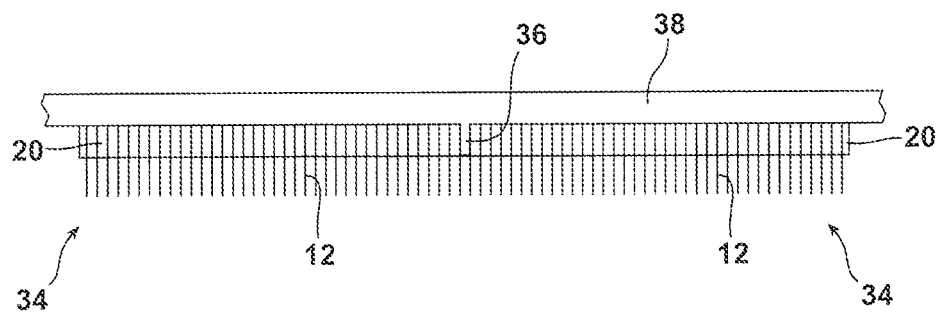
FIG. 4 is a view similar to the earlier Figures but illustrating the formation of a continuous tape from strips of the flexible sheet of aligned carbon nanotube material.
Figure 6:
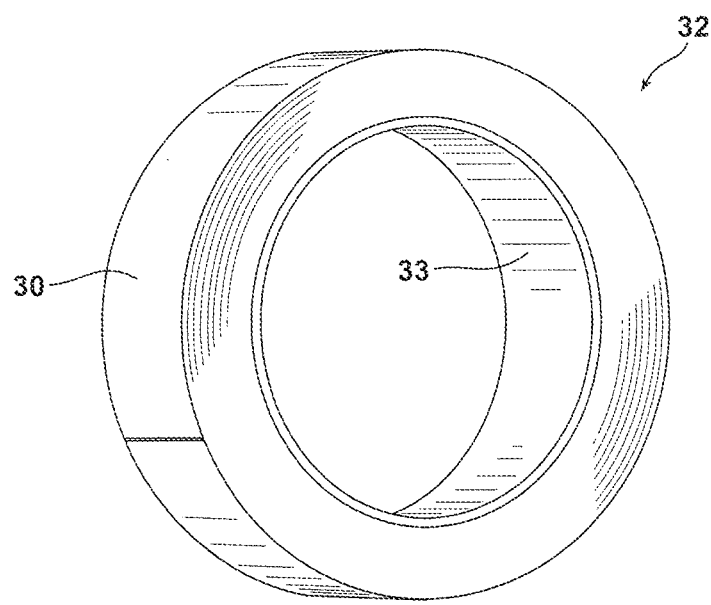
FIG. 6 is a perspective view of an aligned carbon nanotube tape in the form of a roll.

Alternatively, a continuous tape 30 of aligned carbon nanotubes (note roll 32 of tape 30 supported on a support tube 33 illustrated in FIG. 6) may be made from the sheet of aligned carbon nanotubes 22 illustrated in FIG. 3. More specifically, the flexible sheet 22 may be slit into strips 34 of a desired width W. The strips 34 are then aligned end-to-end as illustrated in FIG. 4 to form the tape 30. More specifically, the abutting ends 36 of the strips 34 are aligned on and held in place by an additional, thin, continuous flexible support layer 38. In one possible embodiment the support layer 38 is made of the same material as the flexible support 18. The support layer 38 is continuous and bridges the abutting ends 36 of the adjacent strips. By laminating the support layer 38 to the aligned strips 34 with an appropriate adhesive, heat fusion or by other means, a continuous tape 30 is provided.

Figure 5:
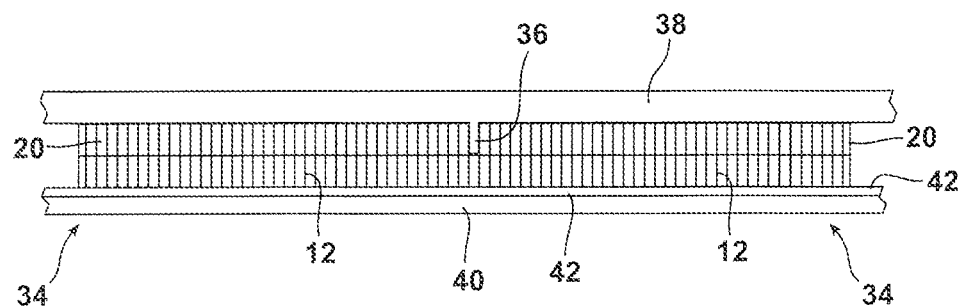
FIG. 5 is a view similar to FIG. 4 but showing the addition of an optional ply layer to the continuous tape.

As illustrated in FIG. 5, for certain applications it could be desirable to add a peel-able ply sheet 40 to the opposite or otherwise exposed face of the carbon nanotube array 12. The ply sheet 40 may be made from substantially any appropriate material including but not limited to polytetraflouroethylene, polyester, nylon, coated paper, coated fabric, silicone, wax, polyolefin, metal or rubber and mixtures thereof. An adhesive layer 42 may be provided between the carbon nanotube array 12 and the peel ply sheet 40 in order to hold the ply sheet in position. The adhesive layer 42 may he made from, for example, thermosets, latexs, rubbers, acrylics, pressure sensitive adhesives, silicones or other natural or synthetic adhesives and mixtures thereof.

The flexible substrate-free sheets 22 have a large number of uses. The sheets 22 work particularly well when used as a thermal interface material (TIM) because the tips 50, 52 of the nanotubes 35 are exposed and allowed to directly contact the upper and lower substrates being joined at an interface. Interstitially infiltrated polymer 20 between the lengths of the nanotubes 35 provides for interfacial adhesion, and the capacity to be co-cured as a thermally conductive, adhesive interface material. Furthermore, the compressive compliance of the array sheet 22, enables the nanotube tips 50, 52 to better conform to surface roughness of an interface. The nanotubes 35 can be elastically compressed in the z or through-thickness direction, allowing for enhanced contact with rough surfaces.

In one particularly useful application schematically illustrated in FIG. 8, an electronic device 100 is provided with improved thermal characteristics. The device 100 comprises an electronic component 102, a heat transfer device 104 and a thermal interface material 106 connecting the electronic component with the heat transfer device. The electronic component 102 may be substantially any electronic or electrical component that generates heat, including but not limited to a computer CPU, a smartphone CPU, an LED, a transistor, a memristor, a resistor, an integrated circuit, a circuit board, a thermoelectric heat source or the like. The heat transfer device 104 may be, but is not limited to, a heat sink, a heat pipe, a heat spreader, thermoelectric active material, or the like.

The thermal interface material 106 comprises the sheet 22. The partially cured polymer material 20 within the interstitial space between the carbon nanotubues 35 provides potential for surface adhesion. Thus, the sheet 22 has the necessary compliance to follow the surfaces of the electronic component 102 and heat transfer device 104 at the interface. At the same time, the polymer material 20 provides sufficient structural support to maintain the integrity of the nanotube array 12. As a result of the compliant nature of the sheet 22, the exposed ends or tips 50, 52 of the material 106 are brought into intimate contact with both the electronic component 102 and heat transfer device 104 with the intrinsic Z-aligned nanotubes 25 as high efficiency thermal conduits through the interface. The thermal interface material can be used to scavenge or harvest waste heat and preferentially conduct this heat in the direction of the nantotube axes. This can be useful to conduit thermal energy to a thermoelectric device.

In another application schematically illustrated in FIG. 9, a current collecting device 200 comprises a current collector component 202, a charge donor device 204 and a current collector interface 206. The current collector component 202 includes, but is not limited to, metals, metal meshes, carbon, graphite, carbon coated metals, carbon coated polymers. The charge donor device 204 includes, but is not limited to, a capacitor, battery, electrodes, semiconducting materials, electrolyte in a capacitor, the electrolyte in a battery, and variations thereof. The current collector interface 206 is the sheet 22 with the array 12 of carbon nanotubes 35 having the exposed ends or tips 50, 52. The Z-aligned nanotubes 35 function as high efficiency conductors of current/charge across the interface between the current collector component 202 and the charge donor device 204.

In yet another application, a solar thermal energy collecting device 300 is schematically illustrated in FIG. 10. The device 300 includes a solar thermal energy collecting component 302 and a solar thermal energy heating device 304. The aligned nanotubes 35 of the flexible sheets 22 function as the solar thermal energy absorbing/receiving material of the collecting component 302.

The solar thermal energy interface material 306 is the sheet 22 with the carbon nanotube array 12 having the exposed nanotube tips or ends 50, 52. The Z-aligned nanotubes 35 function as high efficiency thermal conductors across the interface between the solar thermal energy collecting component 302 and the solar thermal energy heating device 304.

In any of the embodiments, the continuous tape 30 may be fully cured following the unwrapping of the support layer. The work piece may be selected from a group of structures including, but not limited to, a rocket motor casing, a microprocessor chip, laser equipment, filament-wound composites, laminate composites, fiber reinforced composites, sheet molded materials, and planar and compound-curved interfaces between heat sources and heat sinks, wherein the nanotube array best functions as a thermal interface material, utilizing the intrinsic Z-aligned nanotubes as thermal conduits through the interface.

The following example is presented to further illustrate the invention, but it is not to be considered as limited thereto.

EXAMPLE

This example relates to the production of films using an epoxy matrix within CND-grown multiwall carbon nanotubes grown on a quartz substrate to approximately 100-500 microns in length. Apart from the multiwall carbon nanotube (MWCNT) synthesis, the method is simple, straight-forward, and effective, which is an important part of its attractiveness.

Multiwall carbon nanotubes were grown, primarily on one side, of quartz substrates (3.5"×36"×⅛") to an approximate thickness of between 50 and 500 microns. The process used is generally outlined in U.S. Pat. Nos. 7,160,531 and 7,504,078. The parameters of the process can be varied to produce MWCNTs of longer length.

The cooled MWCNT-covered quartz substrates were then laid flat with the MWCNT arrays facing up. A thin layer of pre-mixed (epoxy+hardener) was applied in a thin layer to a PTFE coated flexible sheet (pre-cut to completely cover the exposed MWCNT array), and quickly placed over the exposed MWCNTs with the wet-epoxy side face-down onto the exposed MWCNT array. A weight was placed completely over the dry side of the PTFE sheet (facing up) to press the epoxy into the MWCNT array evenly.

The epoxy was then allowed to infiltrate into the MWCNT array. (This process likely occurs very quickly and is accelerated by the capillary action of the interstices between adjacent nanotubes in the MWCNT array.)

Without removing the PTFE sheet, the epoxy was partially cured by allowing it to react, at room temperature, for 5 days. This is commonly known as B-staging of the epoxy, after which the epoxy was a tacky solid. (B-staging can be sped up significantly by the addition of heat, or by changing the epoxy chemistry. However, if the cured epoxy is brittle, it must be cooled quickly to prevent complete curing.)

A desirable feature of the matrix was that it be flexible enough to facilitate the bending stresses applied during the removal of the infiltrated array from the substrate. This was subtly addressed by only using a thin layer of epoxy during infiltration, if a thick layer of epoxy were allowed to soak into the array, completely wetting it and partially cure, the resulting array would adhere to the substrate. The thin layer of epoxy doesn't completely wet the array, but imparts enough mechanical integrity to sufficiently hold it together. The epoxy-starved array is ideally suited for application as inter-laminar through-thickness heat-transfer material in epoxy matrix composites because it also serves to soak up excess epoxy used during the processing of the laminated or filament-wound composites.

The B-staged epoxy infiltrated MWCNT array was then removed from the underlying quartz substrate in a single large piece by "shaving" it from the substrate. Here a sharp razor was held at a shallow angle to and against the quartz surface, and pushed forward, thus cutting the infiltrated array free from the quartz in one large piece.

It should be noted that during the MWCNT synthesis, the MWCNT array is inherently bound to the quartz substrate beneath. Similarly, as-grown MWCNT arrays on metallic substrates tend to be even more tightly bound.

In one particularly useful and specific manner, the interstitial infiltration of the nanotube array is achieved by first having an uncured epoxy matrix 20 filmed onto the flexible support 18 resulting in a homogeneously thin film. At room temperature the epoxy film is slightly tacky, but uncured. This film is then placed over the aligned carbon nanotube array 12. The array 12, on substrate 14, with epoxy film 20 in contact with the exposed face of the array and on backer 18 with release coating 16 is then placed onto a flat, sturdy, heated aluminum plate and covered with a breather fabric for subsequent vacuum bagging. Utilizing typical vacuum bagging composite fabrication techniques, vacuum bagging gum tape is pre-applied to the aluminum forming a perimeter around the nanotube array stack (14, 12, 20, 16, 18, from bottom to top). The heated aluminum plate quickly heats the stack to approximately 80° C., causing the filmed epoxy 20 to drastically and quickly (within 10 s of seconds) to reduce in viscosity to a watery consistency. As quickly as possible, a temperature resistant polymer vacuum bag is pressed over the stack adhering to the gum tape perimeter, and a strong vacuum is pulled, causing the atmospheric pressure to homogeneously press the epoxy film into the nanotube array surface. Simultaneously, as the heat reduces the epoxy film's viscosity to a watery consistency, the epoxy film gets homogeneously drawn into the interstitial space between the nanotube lengths by capillary action. After a very short dwell time (10 s of seconds), the vacuum is released, the bag cut, and the epoxy film backer carefully removed leaving the epoxy interstitially infiltrated into the nanotube array. Silicone coated backer paper 18 assists in selective release of the packer paper 18 from the nanotube array, leaving the epoxy interstitially infiltrated into its thickness. Lastly, the interstitially infiltrated nanotube array, still fixed to its growth substrate 14, is moved to an un-heated plate of aluminum, which quickly cools the substrate, the array, and the epoxy now infiltrated into the inter-nanotube interstices. This cooling prevents full cure of the epoxy, and enables it to be harvested as a free standing film, with both top and bottom nanotube tips 50, 52, exposed or uncovered by a layer of epoxy. Further, since the epoxy is uncured, the nanotube array can be utilized, in an interfacial situation between for example, a heat generator and a heat sink, to both provide for enhanced interfacial thermal transport, and to bond the interface as the interstitially infiltrated epoxy is externally cured at a later time.

The resulting free-standing B-staged epoxy infiltrated MWCNT arrays, were in a sheet form and flexible enough to be conformed over curved surfaces or cut into desired shapes by a shaped-cutter technique, or let flat. A final curing of the epoxy can then be administered by simply heating to approximately 150° C. for 1 hr. This hardens the epoxy matrix, locking-in the desired shape of the film. It should be noted that the flexibility and softness of the B-staged films is desirable to impart the films with the conformability necessary to tightly fit the interface in which they are placed. A high degree of surface contact with little void space is desirable for thermal conductivity through an interface between parts (such as between a CPU chip and its heat sink).

Yet another aspect of the present invention is a method of increasing unidirectional heat conduction from a work piece.

Figure 7B:
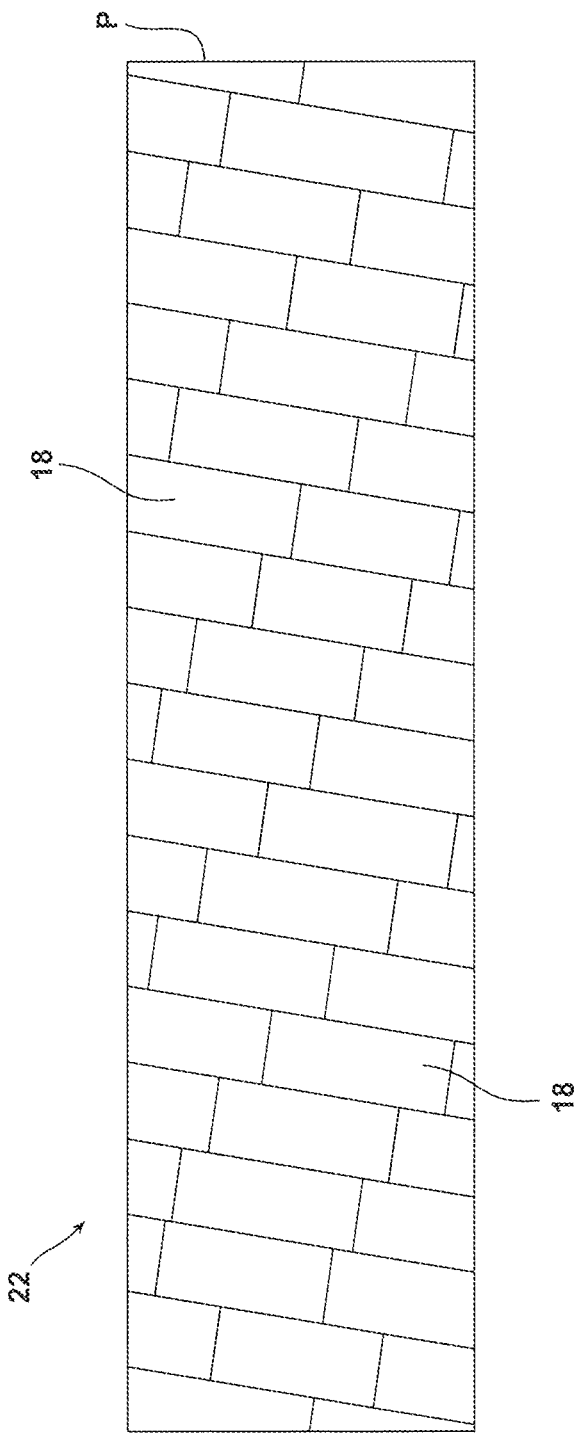

This method may be broadly described as comprising the step of wrapping the work piece or selectively placing arrays from a continuous tape of aligned carbon nanotubes. The method is illustrated in detail in FIGS. 7A and 7B. As illustrated in FIG. 7A, the method comprises removing the ply layer 40 from the tape 30 as the tape is wound around the work piece P with the carbon nanotube array layer 12 engaging the work piece P. The tape 30 may be wrapped in a "filament-winding" manner so as to provide a continuous wound surface with edge to edge engagement of the tape and no overlap. As noted above, the tape 30 incorporates a B-staged polymer 20 and is flexible enough to be conformed to the curved surfaces of the work piece P. After winding the tape 30 over the surface of the work piece P, the support layer 38 is removed by unwrapping (see FIG. 7B). This is done while leaving the strips of aligned carbon nanotube material 22 in position completely wrapped around the work piece P. The wound work piece P is then subjected to a final curing of the polymer 20 or additional material layers can be added utilizing the nanotube arrays as an interface material for enhanced through thickness thermal conduction. For example, where epoxy is utilized for the polymer 20 the final curing could be administered by simply heating to approximately 150° C. for 1 hour. This locks the tape 30 into a work piece conforming shape providing a tight interface and high degree of surface contact between the carbon nanotube array 12 and the work piece P. By providing tight contact and minimizing void space high thermal conductivity is provided particularly along the nanotube axes and through an interface utilizing the nanotubes as a thermal interface material. As a consequence, heat is rapidly conducted from the work piece P through the carbon nanotube array. It should be appreciated that the work piece P may take the form of substantially any number of structures including but not limited to a microprocessor chip, a rocket motor casing, laser equipment, filament-wound composites, laminate composites, electronics components, fiber reinforced composites, sheet molded materials and planar and compound-curved interfaces between heat sources and heat sinks.

The foregoing description of the preferred embodiments of the present invention have been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled. The drawings and preferred embodiments do not and are not intended to limit the ordinary meaning of the claims in their fair and broad interpretation in any way.

What is claimed:

1. A thermal interface material, comprising:
   a nanotube array stack comprising an array of aligned carbon nanotubes and a substrate, wherein the array is attached to the substrate, said array including a first face formed from exposed first ends of said aligned carbon nanotubes, wherein a flexible non-stick support is in contact with the first face and further wherein a partially cured resin is homogenously drawn into interstitial space of nanotube lengths from the flexible support under heat and pressure, wherein said flexible support is made from a material selected from a group consisting of polytetrafluoroethylene, polyester, coated paper, coated fabric, silicone, wax, polyolefin, metal, rubber and mixtures thereof.

2. The material of claim 1, wherein said partially cured resin is made from a material selected from a group consisting of thermosetting resin, epoxy, vinyl ester, silicone, cyanate ester, bismaleimide (BMI), polymide, polyolefin, polyurethane, phenolic, a carbonizable resin, polyfurfural and mixtures thereof.

3. The material of claim 1, wherein said exposed carbon nanotube first ends comprise 100 percent of the outermost surface area of said first face.

4. The material of claim 1, wherein the flexible non-stick support is polytetrafluoroethylene (PTFE).

5. The material of claim 1, further comprising a heat source in contact with the flexible non-stick support.

6. A current collecting device, comprising:
   a current collector component;
   a charge donor device; and
   a current collector interface material connecting said current collector component with said charge donor device, said current collector interface material comprising the thermal interface materials of claim 1.

7. The material of claim 6, wherein said partially cured resin is made from a material selected from a group consisting of thermosetting resin, epoxy, vinyl ester, silicone, cyanate ester, bismaleimide (BMI), polymide, polyolefin, polyurethane, phenolic, a carbonizable resin, polyfurfural and mixtures thereof.

8. A thermal interface material, consisting of:
   a nanotube array stack consisting of an array of aligned carbon nanotubes and a substrate, wherein the array is attached to the substrate, said array including a first face formed from exposed first ends of said aligned carbon nanotubes, wherein a flexible non-stick support filmed with a partially cured resin is homogenously drawn into interstitial space of nanotube lengths, wherein said flexible support is made from a material selected from a group consisting of polytetrafluoroethylene, polyester, coated paper, coated fabric, silicone, wax, polyolefin, metal, rubber and mixtures thereof.

9. The material of claim 8, wherein said partially cured resin is an epoxy.

10. The material of claim 8, wherein said partially cured resin is made from a material selected from a group consisting of thermosetting resin, epoxy, vinyl ester, silicone, cyanate ester, bismaleimide (BMI), polymide, polyolefin, polyurethane, phenolic, a carbonizable resin, polyfurfural and mixtures thereof.

11. The material of claim 8, wherein the flexible non-stick support is polytetrafluoroethylene (PTFE).

* * * * *